(12) United States Patent
Stettler et al.

(10) Patent No.: US 6,867,104 B2
(45) Date of Patent: Mar. 15, 2005

(54) METHOD TO FORM A STRUCTURE TO DECREASE AREA CAPACITANCE WITHIN A BURIED INSULATOR DEVICE

(75) Inventors: Mark A. Stettler, Hillsboro, OR (US); Borna Obradovic, Hillsboro, OR (US); Martin D. Giles, Portland, OR (US); Rafael Rios, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/334,181

(22) Filed: Dec. 28, 2002

(65) Prior Publication Data

US 2004/0124467 A1 Jul. 1, 2004

(51) Int. Cl.[7] ............................................ H01L 21/336
(52) U.S. Cl. ...................... 438/298; 438/290; 257/347; 257/348

(58) Field of Search ................................ 438/375–376, 438/289, 291; 257/349

(56) References Cited

U.S. PATENT DOCUMENTS 5,923,067 A * 7/1999 Voldman ..................... 257/349
6,121,659 A * 9/2000 Christensen et al. ........ 257/347

* cited by examiner

*Primary Examiner*—Dung A. Le
(74) *Attorney, Agent, or Firm*—Michael D. Plimier

(57) ABSTRACT

Method to form a structure to decrease area capacitance within a buried insulator device structure is disclosed. A portion of the substrate layer of a buried insulator structure opposite the insulator layer from the gate is doped with the same doping polarity as the source and drain regions of the device, to provide reduced area capacitance. Such doping may be limited to portions of the substrate which are not below the gate.

15 Claims, 2 Drawing Sheets

*Prior Art*

METHOD TO FORM A STRUCTURE TO DECREASE AREA CAPACITANCE WITHIN A BURIED INSULATOR DEVICE

BACKGROUND OF THE INVENTION

Buried insulator substrates, such as silicon-on-insulator (SOI) substrates, have become desirable for many microelectronic technologies, including extreme scaling of metal-oxide semiconductor (MOS) and complementary metal-oxide semiconductor (CMOS) devices, advanced MOS junction-type field-effect transistors (MOSFETs), and quantum wires and dots. This is primarily because SOI fabrication processes result in increased packing densities, improved performances, better device isolations and reduced extrinsic parasitic elements, particularly those of the source and drain as well as leakage currents and thus significantly speeding up circuit operations.

An insulator layer within a buried insulator substrate may suppress performance-reducing, and therefore undesirable drain-induced barrier lowering (DIBL) effects in the channel region. The thinner the insulator layer, the more DIBL is reduced and the more drain current performance improves. Unfortunately, as the insulator layer is made thinner, the area capacitance increases, which degrades switching performance. This higher area capacitance causes more coupling between the immediate device and other neighboring devices through the substrate, which leads to undesirable cross-talk or interference between adjacent devices which should be isolated from each other. There is a need for a solution which allows for a very thin insulator layer and therefore high DIBL reduction, while also counteracting the increased area capacitance concomitant with thinner insulator layers.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1:
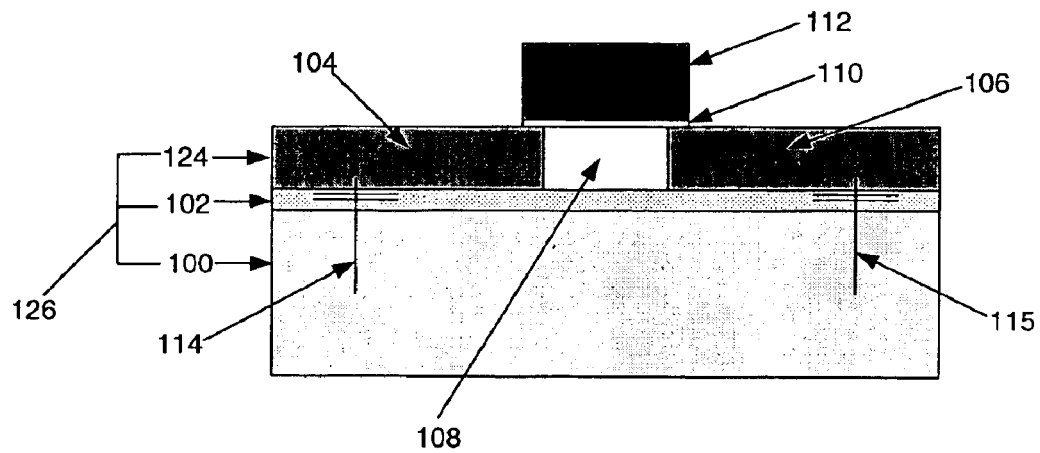
FIG. 1 is a cross sectional depiction of a conventional buried insulator microelectronic structure.

Referring to FIG. 1, a conventional buried insulator microstructure is depicted in cross-sectional view having an insulator layer (102) positioned between a highly-doped substrate layer (100) and a semiconductor body layer (124), the three (102, 100, and 124) collectively comprising a conventional buried insulator substrate (126), above which a gate (112) is positioned, preferably insulated from the body layer (124) by a conventional gate dielectric layer (110). The body layer (124) comprises a channel region (108) between the insulator layer (102) and the gate dielectric layer (110) in one direction, and between a source region (104) and drain region (106) in another direction, as depicted. In a typical NMOS device, the channel region (108) and highly-doped substrate layer (100) may be doped to a first polarity with a P-type dopant, such as boron, and the source (104) and drain (106) regions may be doped to a second polarity opposite that of the first polarity with an N-type dopant, such as phosphorus or arsenic. For convenience, the polarity associated with a P-type dopant may be referred to as a P-type polarity, and the polarity associated with an N-type dopant may be referred to as an N-type polarity. On the contary, in a PMOS device, the channel region (108) and highly-doped substrate layer (100) may be doped to an N-type polarity with a N-type dopant, such as phosphorus or arsenic, and the source (104) and drain (106) regions may be doped to a P-type polarity, opposite that N-type polarity, with an P-type dopant such as boron. The insulator layer (102) may comprise any suitable insulating material, such as silicon dioxide, silicon nitride, or sapphire, which has sufficient thickness and quality to isolate the body layer (124), which conventionally comprises a semiconductor material such as silicon or silicon germanium, from the highly-doped substrate layer (100), which conventionally comprises a monocrystalline semiconductor material, such as monocrystalline silicon, which may be doped as discussed above. The electrical isolation provided by the insulator layer (102) decreases performance-reducing DIBL effects, and while a thinner insulator layer (102) is associated with better DIBL reduction, it also is associated with higher area capacitance (114, 115), which degrades switching performance and increases the likelihood of cross-talk between adjacent devices.

Figure 2:
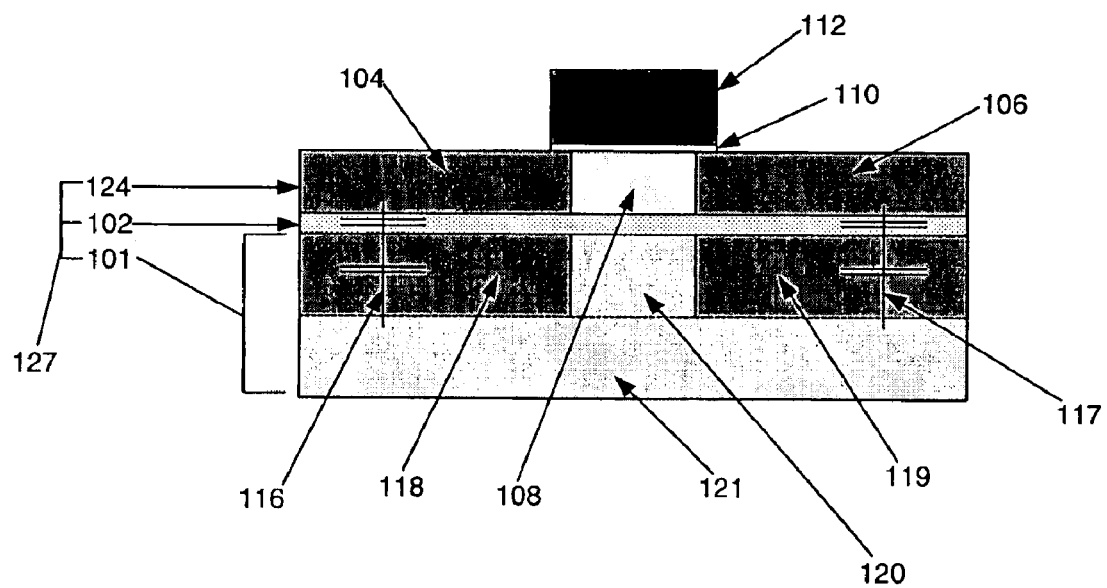
FIG. 2 is a cross sectional depiction of one embodiment of a buried insulator microelectronic structure of the present invention.

Referring to FIG. 2, a buried insulator device is depicted having a structure similar to that of FIG. 1, with the exception that compensated regions (118, 119) are present within the buried insulator substrate (127) of the device of FIG. 2 to decrease the area capacitance (116, 117) between the layers of the buried insulator substrate (127), while preserving the desired DIBL characteristics. The effective area capacitance (116, 117) is decreased by doping the already-doped substrate layer (101) with a dopant of polarity opposite that of the dopant already used to dope the highly-doped substrate (101), to provide a more balanced concentration of positive and negative dopant ions within the compensated regions (118, 119), which results in fewer active ions in the compensated regions (118, 119) and a lower or lighter "net" doping of the compensated regions, preferably close to zero net doping, or a state of substantially complete compensation wherein the area capacitance is minimized. In other words, compensated regions preferably are formed by compensation doping portions of the highly doped substrate adjacent the insulator layer (102) with opposite polarity dopant concentrations substantially equal in magnitude to the preexisting dopant concentration of the highly-doped substrate material of the region. A process to form a compensated buried insulator device such as the embodiment depicted in FIG. 2 is described in reference to FIGS. 3A and 3B.

Figure 3A:
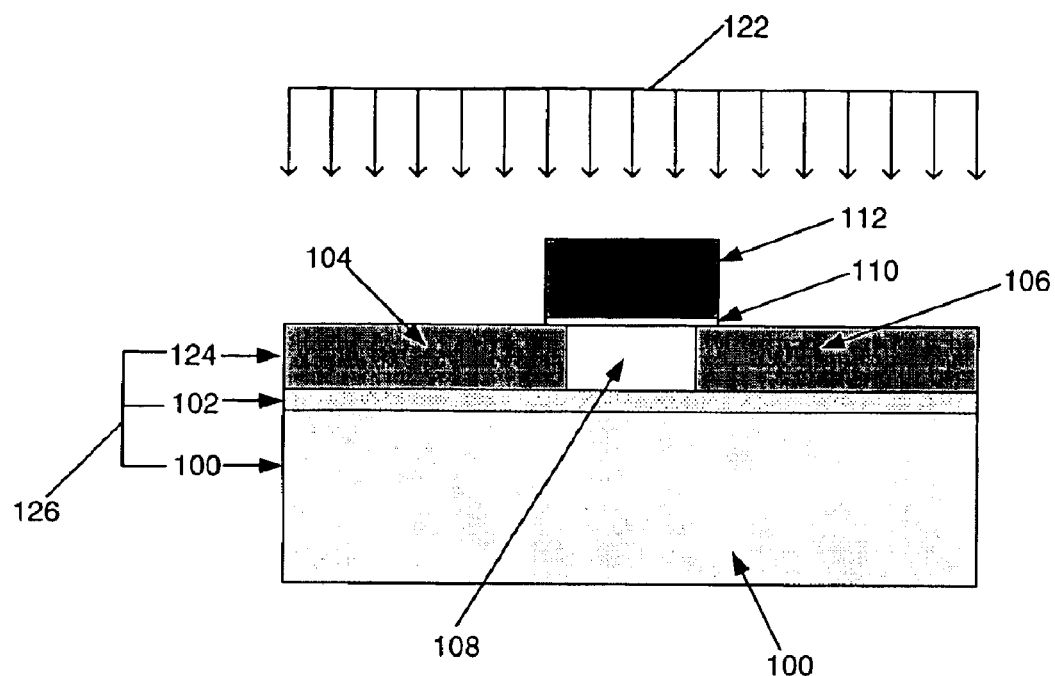
FIGS. 3A–3B are cross sectional views of various aspects of one embodiment of a buried insulator microelectronic structure of the present invention.

Referring to FIG. 3A, a structure similar to that depicted in FIG. 1 is depicted. As shown in FIG. 3A, a dopant implantation (122) is applied to produce compensated regions, such as those depicted in FIG. 3B (118, 119). In one illustrative embodiment, the body layer (124) comprises a thin silicon layer having a thickness between about 50 angstroms and about 100 angstroms, the insulator layer (102) comprises silicon dioxide or silicon oxynitride of approximately the same thickness, and the highly-doped substrate (100) comprises monocrystalline silicon doped to a first polarity with a first dopant to a concentration of about $10^{19}$ dopant atoms per cubic centimeter. The source (104) and drain (106) regions are doped with a second dopant to a second polarity, opposite the first polarity, to a concentration of between about $10^{20}$ and about $10^{22}$ dopant atoms per cubic centimeter, while the channel region (108) is doped with a dopant of the first polarity to a concentration of between about $10^{17}$ and about $10^{19}$ dopant atoms per cubic centimeter. The buried insulator substrate (126) depicted in FIG. 3A may be formed using conventional techniques, such as SIMOX processes, wherein a buried silicon dioxide layer is fabricated by implanting oxygen into a silicon wafer and heat treating the wafer to create a buried insulator layer, and layer transfer processes, wherein a thin film of silicon is bonded to an oxidized handle wafer after separation from a single crystal silicon layer, which may be facilitated by a hydrogen implant to damage the single crystal silicon layer. Doped regions such as the source (104), drain (106), and channel (108) may be formed using conventional ion implantation techniques, or may be grown using epitaxial techniques. Also depicted in FIG. 3A is a gate (112), which is separated from the buried insulator substrate (126) by a gate dielectric (110) layer. The gate (112) and gate dielectric (110), comprising conventional materials such as polysilicon and silicon dioxide, respectively, are formed using conventional techniques. For example, a very thin silicon dioxide gate dielectric layer (110) having a thickness less than about 2 nanometers may be grown using a conventional highly controlled oxidation cycle, and a polysilicon gate (112) having a thickness in the illustrated embodiment greater than about 200 angstroms may be formed using conventional patterning, etching, and deposition techniques, such as low pressure chemical vapor deposition.

Figure 3B:
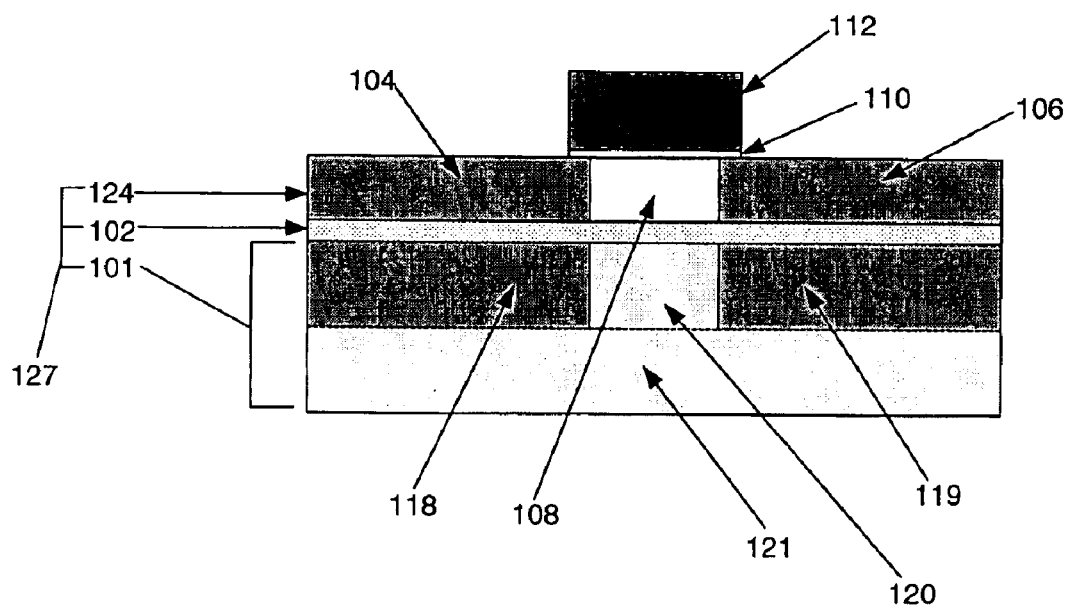

Subsequent to formation of a structure such as the embodiment of FIG. 3A, an implantation (122) may be applied to form compensated regions (118, 119) below the insulator layer (102), as shown in FIG. 3B. As discussed above in reference to FIG. 2, the dopants of the implantation (122) preferably are of the same polarity as the source (104) and drain (106) regions, and of the polarity opposite to that of the channel (108) and highly-doped substrate (100) regions. To prevent unwanted compensation doping of the channel (108), a mask, or "masking structure", may be positioned to shield the channel region (108) from the ion implantation. The masking structure preferably is aligned with the channel region (108), while the compensated regions (118, 119) preferably are aligned with the source (104) and drain (106) regions. The gate (112) and gate dielectric (110), and/or another masking structure (not shown) provide masking functionality. Preferably, the gate (112) and gate dielectric (110) will adequately buffer the channel region (108) and an uncompensated region of the buried insulator substrate (127), as shown in FIG. 3B, from the implantation (122) to preserve device performance and functionality. For example, in the depicted embodiment with dimensions as described above, it is desirable to compensation dope from immediately below the insulator layer (102) to at least 100 angstroms below this point. Where the structure is a PMOS device, for example, with phosphorus as the first dopant for the highly-doped substrate (100) and channel region (108), and boron as the second dopant for the source (104) and drain (106) regions, using the aforementioned concentrations, a compensation doping of about $10^{19}$ atoms of boron per cubic centimeter compensates the phosphorus doping of the same concentration within the compensated regions (118, 119). To focus an implantation (122) of boron at and below the insulator layer (102), at about 200 angstroms in the case of a 100 angstroms body layer (124) and a 100 angstroms insulator layer (102), boron may be implanted using an ion implanter such those sold under the trade name "Quantum Leap™" by Applied Materials Corporation, at about 4 Kev with a dosage of about $4\times10^{13}$ $cm^{-2}$. A gate (112) comprising polysilicon and having a thickness greater than about 200 angstroms, such as 400 angstroms, sufficiently shields the channel region (108) and underlying uncompensated region (120) from the aforementioned boron implantation. Should the gate (112) and gate dielectric (110) of such an embodiment provide inadequate shielding, a masking structure comprising almost any material used in microelectronic processing, such as chromium, silicon nitride, or additional polysilicon may be utilized to shield the implantation, subject to the requirement that the masking structure be of sufficient thickness to adequately block the given implantation. A masking structure comprising such materials may, for example, be deposited using conventional techniques such as physical vapor deposition or chemical vapor deposition, and then etched away and removed subsequent to the implantation (122).

As regards the requisite thickness of a masking structure, such as a polysilicon gate, to provide adequate shielding during a compensation implantation (122), the implantation depth of ions implanted into matter may be calculated using a quantum mechanical treatment of ion-atom collisions, as is described in the book, "*The Stopping and Range of Ions in Solids*", by J. F. Ziegler, J. P. Biersack, and U. Littmark, Pergammon Press, New York, 1985, and also integrated into the related "SRIM" and "TRIM" software applications, which are widely available. For example, referring to FIG. 3A, a relationship between implantation energy of accelerated dopant ions in an implantation (122) and the implantation depth of such ions into the various depicted structures, such as the gate (112) and body layer (124), may be readily determined. Implantation dosage is conventionally optimized given the implanted ion type and target materials and dimensions. A series of several relatively small implantations may be substituted for one with higher implantation dosage and/or power, as would be apparent to one skilled in the art.

Thus, a novel solution for decreasing the area capacitance within a buried insulator device without sacrificing DIBL advantages is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A method to form a silicon-on-insulator structure comprising:
    compensation doping a buried insulator substrate, the buried insulator substrate comprising an insulator layer between a body layer with a channel region between a source region and a drain region and a highly-doped substrate layer doped to a first doping polarity, with dopants of a second polarity opposite the first polarity to form compensated regions in the highly-doped substrate layer adjacent the insulator layer.

2. The method of claim 1 wherein compensating doping forms compensated regions with dopant concentrations substantially equal in magnitude to the dopant concentration of the highly-doped region of the substrate layer.

3. The method of claim 2 wherein the magnitudes of dopant concentrations for the compensated regions and highly-doped region are about $1\times10^{19}$ atoms per cubic centimeter.

4. The method of claim 1 wherein doping comprises implanting dopant ions into the compensated regions via ion implantation.

5. The method of claim 4 wherein the source and drain regions are doped to the second polarity and the channel region is doped to the first polarity, and wherein the channel region is shielded from implanting dopant ions of the compensation doping by a masking structure.

6. The method of of claim 5 wherein the channel region is shielded from implanting dopant ions by a gate.

7. The method of claim 1 further comprising, prior to the compensation doping, doping to form a channel region between a source region and a drain region, the source and drain regions being doped to the second polarity and the channel region being doped to the first polarity.

8. The method of claim 7 wherein the second polarity is an N-type polarity and the first polarity is a P-type polarity, forming a NMOS structure.

9. The method of claim 7 wherein the second polarity is an P-type polarity and the first polarity is a N-type polarity, forming a PMOS structure.

10. The method of claim 7 wherein the thin substrate layer and highly-doped substrate layer comprise silicon, and wherein the insulator layer comprises silicon dioxide.

11. The method of claim 10 wherein the body layer and insulator layer both have a thickness of about 100 angstroms, the highly-doped region and channel region are doped to a first doping polarity at a concentration of about $1\times10^{19}$ first dopant atoms per cubic centimeter, the source and drain regions are doped to a second doping polarity at a concentration of about $1\times10^{21}$ second dopant atoms per cubic centimeter, and wherein compensation doping to form compensated regions comprises further doping the compensated regions with second dopant atoms to a concentration of about $1\times10^{19}$ second dopant atoms per cubic centimeter.

12. The method of claim 11 wherein the first dopant atoms are boron atoms, and wherein the second dopant atoms are selected from the group consisting of arsenic and phosphorus atoms.

13. The method of claim 11 wherein the second dopant atoms are boron atoms, and wherein the first dopant atoms are selected from the group consisting of arsenic and phosphorus atoms.

14. The method of claim 1, wherein the formed compensated regions the compensated regions are aligned with the source and drain regions.

15. The method of claim 5, wherein the masking structure is aligned with the channel region.

* * * * *